United States Patent
Fan

(10) Patent No.: US 8,225,945 B2
(45) Date of Patent: Jul. 24, 2012

(54) RACK FRAME

(75) Inventor: Chen-Lu Fan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/955,930

(22) Filed: Nov. 30, 2010

(65) Prior Publication Data

US 2012/0019118 A1 Jan. 26, 2012

(30) Foreign Application Priority Data

Jul. 26, 2010 (CN) .......................... 2010 1 0236789

(51) Int. Cl.
*A47F 7/00* (2006.01)
(52) U.S. Cl. ........................... 211/26; 211/182; 211/189
(58) Field of Classification Search .................... 211/26, 211/182, 189, 191; 312/265.1
See application file for complete search history.

(56) References Cited

U.S. PATENT DOCUMENTS

| | | | | |
|---|---|---|---|---|
| 4,513,669 A * | 4/1985 | Steinke | .......................... | 108/107 |
| 5,749,476 A * | 5/1998 | Besserer et al. | ................. | 211/26 |
| 5,930,972 A * | 8/1999 | Benner et al. | ................. | 52/653.1 |
| 6,012,791 A * | 1/2000 | Benner et al. | ................ | 312/265.2 |
| 6,062,664 A * | 5/2000 | Benner | ........................ | 312/265.1 |
| 6,190,081 B1 * | 2/2001 | Besserer et al. | ............... | 403/231 |
| 6,206,494 B1 * | 3/2001 | Benner et al. | ............... | 312/265.4 |
| 6,273,281 B1 * | 8/2001 | Berglund | ....................... | 211/187 |
| 7,896,177 B1 * | 3/2011 | Toma | ............................. | 211/182 |

* cited by examiner

*Primary Examiner* — Korie H. Chan
(74) *Attorney, Agent, or Firm* — Altis Law Group, Inc.

(57) ABSTRACT

A rack frame includes a first frame pole, a second frame pole, a support pole and a bar fixed on the support pole. The support pole includes a first portion, a second portion intersecting with the first portion at a corner, and a plurality of securing holes defined on the first and second portions. Each of the securing holes includes an insert slot adjacent to the corner and a protrusion hole communicating with the insert slot. The bar includes a first side plate corresponding to the first portion, a second side plate corresponding to the second portion, and a plurality of hooks fixed on the first and second side walls corresponding to the plurality of securing holes. The plurality of hooks pass through the corresponding protrusion holes to insert in the insert slot.

19 Claims, 4 Drawing Sheets

RACK FRAME

BACKGROUND

1. Technical Field

The disclosure generally relates to a rack frame for supporting servers.

2. Description of Related Art

A typical rack frame for supporting servers usually includes two rectangular frames and four support poles connected between the two rectangular frames. Each of the support poles includes a bar for fixing peripheral devices. Each of the frames includes a first frame pole and a second frame pole, perpendicularly connected to the first frame pole. A securing member is connected between the first and second frame poles and the support pole to fix them together. The bars are then welded on the corresponding support posts. However, the bars are easily broken off from the support poles when the solder is weak.

Therefore there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
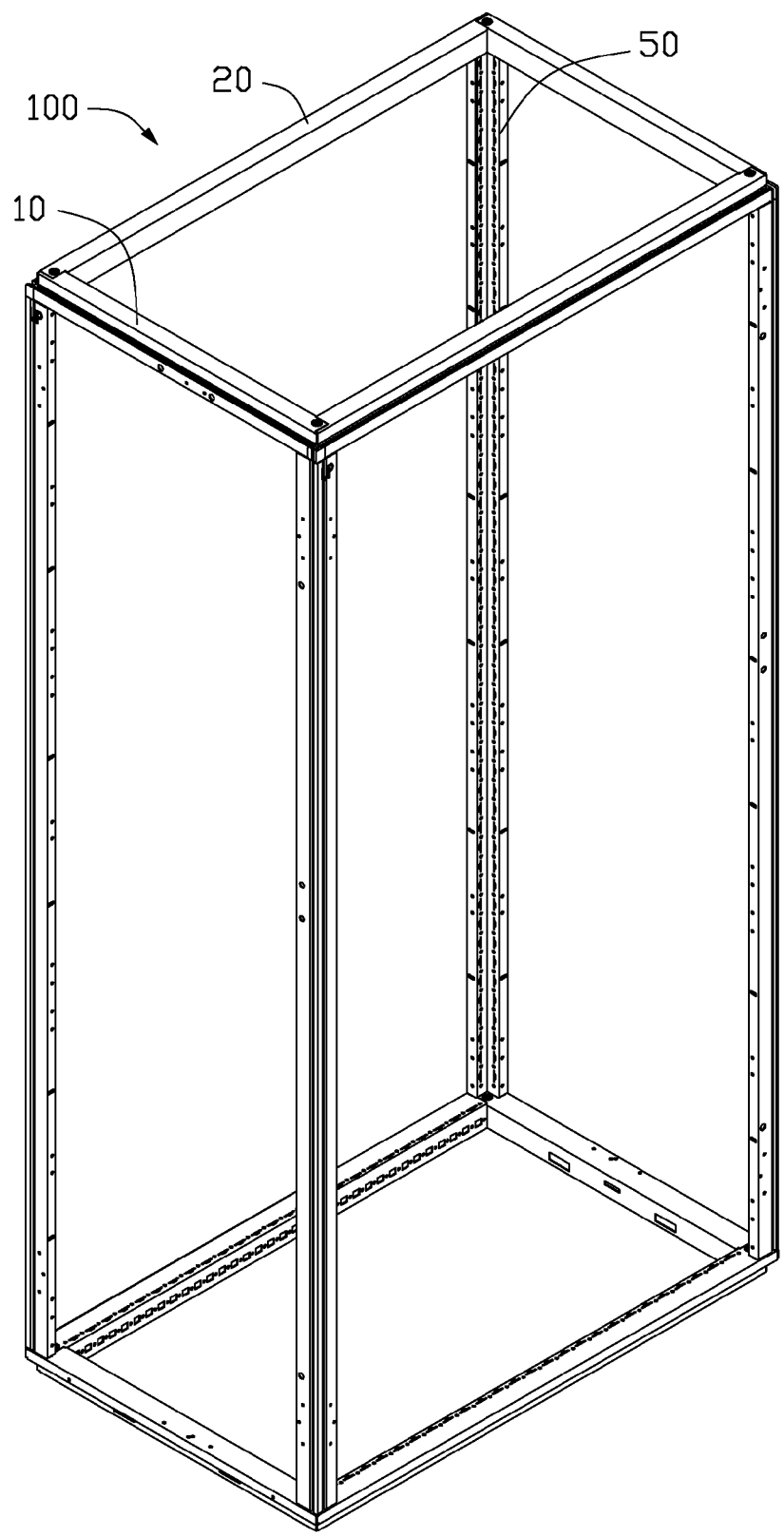
FIG. 1 is an isometric view of an embodiment of a rack frame.

Referring to FIG. 1, a rack frame for supporting servers includes two rectangular frames 100 and four support poles 50 connected between the two rectangular frames 100. Each of the rectangular frames 100 includes two parallel first frame poles 10 and two parallel second frame poles 20. Each of the first frame poles 10 is perpendicular to each of the second frame poles 20. Each of the support poles 50 is perpendicular to the first and second frame poles 10 and 20.

Figure 2:
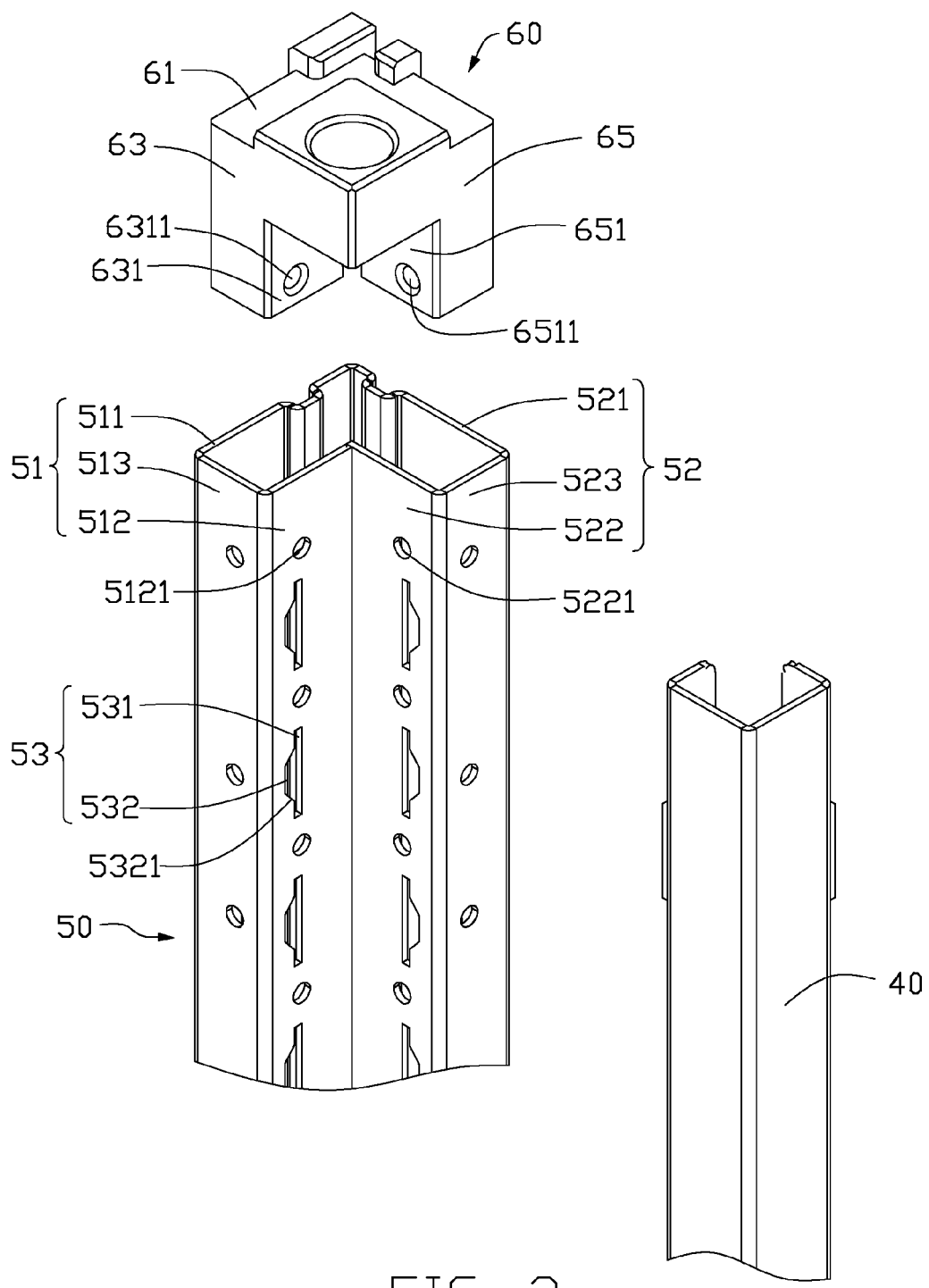
FIG. 2 is an exploded, isometric view of one embodiment of a support pole and a support post of FIG. 1.
Figure 3:
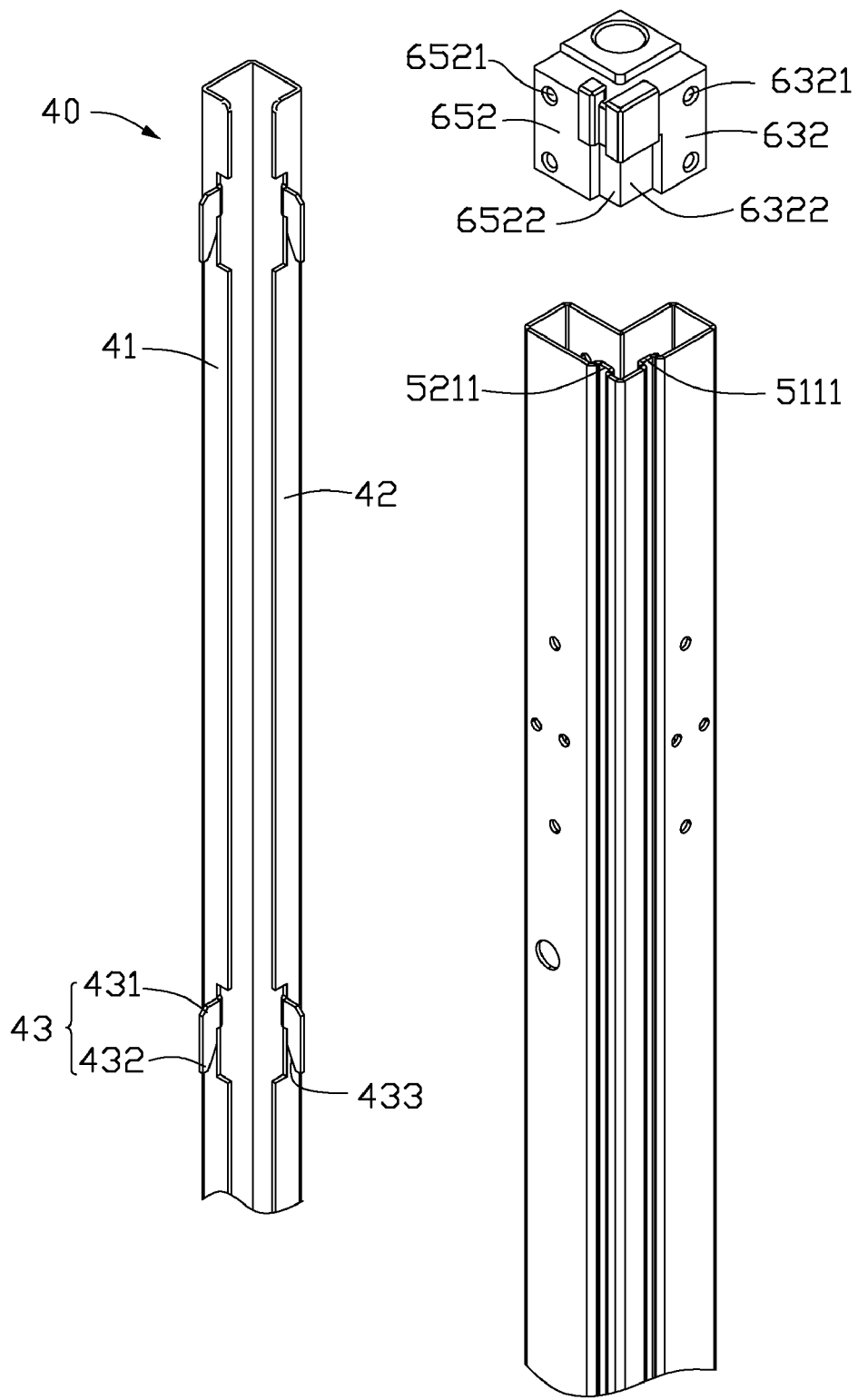
FIG. 3 is an exploded, isometric view of another embodiment of a support pole and a support post of FIG. 1.

Referring to FIGS. 2 and 3, a securing member 60 is connected between the first and second frame poles 10, 20. The securing member 60 includes a base 61, a first securing portion 63, and a second securing portion 65 perpendicularly extending from two side edges of the base 61. The first securing portion 63 includes a first side surface 631 and a second side surface 632 parallel to the first side surface 631. The first side surface 631 defines a first fixing hole 6311. The second side surface 632 defines a second fixing hole 6321 and a first positioning portion 6322 formed on a bottom of the second side surface 632. The second securing portion 65 includes a third side surface 651 and a fourth side surface 652, that is parallel to the third side surface 651. The third side surface 651 defines a third fixing hole 6511 thereon. The fourth side surface 652 defines a fifth fixing hole 6521 and a second positioning portion 6522 form on a bottom of the fourth side surface 652.

The support pole 50 receives the base 61 and accommodates the first and second securing portions 63 and 65. The support pole 50 includes a first portion 51 and a second portion 52 intersecting with the first portion 51 at a corner. The first portion 51 includes a first side wall 511, a second side wall 512, parallel to the first side wall 511, and a third side wall 513, perpendicularly connected to the first and second side walls 511 and 512. The first side wall 511 defines a first protrusion portion 5111 corresponding to the first positioning portion 6322. The second side wall 512 defines a first through hole 5121 corresponding to the first fixing hole 6311. The second portion 52 includes a fourth side wall 521, a fifth side wall 522, parallel to the fourth side wall 521, and a sixth side wall 523, perpendicularly connected to the fourth and fifth side walls 521 and 522. The fourth side wall 521 defines a second protrusion portion 5211 corresponding to the second positioning portion 6522. The fourth side wall 521 defines a second through hole 5221, that corresponds to the third fixing hole 6511. The support pole 50 interval defines a number of securing holes 53 thereon. Each of the securing holes 53 includes an insert slot 531, adjacent to the corner, and a protrusion hole 532, communicating with the insert slot 531. The length of the protrusion hole 532 in a direction along the support pole 50 is less than that of the insert slot 531. In one embodiment, the protrusion hole 532 is trapezium shaped. The protrusion hole 532 defines an inclining edge 5321.

A bar 40 is fixed on the support pole 50. The bar 40 includes a first side plate 41, corresponding to the second side wall 512, and a second side plate 42, corresponding to the second side wall 522. The bar 40 defines a number of hooks 43 corresponding to the number of securing holes 53 on the support pole 50. Each of the hooks 43 includes a connection portion 431, connected to the bar 40, and a lock portion 432, connected to the connection portion 431. The connection portion 431 is inserted in the insert slot 531. The lock portion 432 is secured on the support pole 50. A distal end of the lock portion 432 is tapered. A length of the lock portion 432 is greater than that of the connection portion 431. The lock portion 432 and the bar 40 corporately form a long slot 433, therebetween, for receiving a side edge of the insert slot 531. A thickness of the connection portion 431 in a horizontal direction perpendicular to the support pole 50 is equal to a width of the insert slot 531. The lock portion 432 is configured to pass through the protrusion hole 532 to be guided along the inclining edge 5321 to move into the corresponding insert slot 531.

Figure 4:
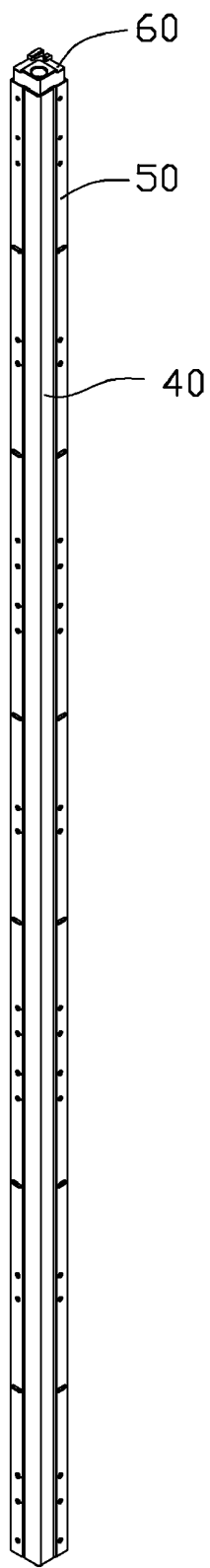
FIG. 4 is an assembled view of the embodiment of FIG. 2.

Referring to FIG. 4, in assembly, the securing member 60 is fixed on the support pole 50. The first securing portion 63 is inserted between the first and second side walls 511 and 512 of the first portion 51. The second securing portion 65 is inserted between the first and second side walls 521 and 522 of the second portion 52. The protrusion portion 5111 of the support pole 50 is received in the positioning portion 6322 of the second side surface 632. The protrusion portion 5211 of the support pole 50 is received in the positioning portion 6522 of the fourth side surface 652. The fixing hole 6311 of the first side surface 631 is aligned with the through hole 5121 of the second side wall 512. The fixing hole 6511 of the third side surface 651 is aligned with the through hole 5221 of the second side wall 522. A number of fastening members (not shown) pass through the corresponding through holes 5121 and 5221 and fixing holes 6311 and 6511 to fix the bar 40, the support pole 50 and the securing member 60 together.

The hooks 43 of the bar 40 are then inserted in the corresponding securing holes 53. The hook 43 on one of the first and second side plates 41 and 42 is inserted in the insert slot 531 of the corresponding securing hole 53. The hook 43, inserted in the insert slot 531, moves slightly into the corresponding protrusion hole 532. The hook 43 on the other one of the first and second side plates 41, 42 and the corresponding insert slot 531 corporately form a long gap therebetween. The long gap makes the hook 43 on the other one of the first and second side plates 41 and 42 easily inserted in the corresponding insert slot 531. The hooks 43 are moved in the direction along the support pole 50 to be inserted the connection portions 431 in the corresponding insert slots 531. A side edge of the securing hole 53 is received in the corresponding long slot 433. A number of fastening members (not shown) pass through the corresponding through holes (not shown) on the first and second frame poles 10 and 20, and the corresponding fixing holes 6321 and 6521 to fix the securing member 60 and the first and second frame poles 10 and 20 together.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A rack frame, comprising:
a first frame pole and a second frame pole;
a securing member connected to the first and second frame poles;
a support pole connected to the securing member, the support pole comprising:
a first portion and a second portion intersecting with the first portion at a corner;
a plurality of securing holes defined on the first and second portions; and each of the plurality of securing holes comprises an insert slot and a protrusion hole communicating with the insert slot; the protrusion hole defining an inclining edge connected to the insert slot; and
a bar fixed on the support pole, the bar comprising:
a first side plate corresponding to the first portion and a second side plate corresponding to the second portion; and
a plurality of hooks, fixed on the first and second side plates corresponding to the plurality of securing holes; and each of the plurality of hooks is configured to pass through the protrusion hole to be guided along the inclining edge to move in the insert slot.

2. The rack frame of claim 1, wherein the securing member comprises a base, a first securing portion and a second securing portion perpendicularly extended from two side edges of the base.

3. The rack frame of claim 2, wherein the first securing portion comprise a side surface; the first portion comprises a first portion first side wall which is configured to align with the side surface; the second portion comprises a second portion first side wall which is substantially perpendicular to the first portion first side wall; the first portion first side wall is connected to the second portion first side wall; both the first and second securing portions comprise two positioning portions; and the first portion first side wall and the second portion first side wall comprise two protrusion portions, the two protrusion portions correspond to the two positioning portions.

4. The rack frame of claim 3, wherein the first portion further comprises a first portion second side wall that is parallel to the first portion first side wall; the second portion further comprises a second portion second side wall that is parallel to the second portion first side wall; the first portion second side wall is connected to the second portion second side wall; and the plurality of securing holes are defined in the first portion second side wall and the second portion second side wall.

5. The rack frame of claim 1, wherein the protrusion hole is trapezium shaped; and a length of the protrusion hole in a direction along the support pole is less than that of the insert slot.

6. The rack frame of claim 1, wherein each of the plurality of hooks comprises a connection portion connected to the bar; each of the connection portions extend to form a lock portion; the connection portion is configured to be inserted in the insert slot; and the lock portion is configured to be secured on the support pole.

7. The rack frame of claim 6, wherein a distal end of the lock portion is taper shaped; and a length of the lock portion is greater than that of the connection portion.

8. The rack frame of claim 6, wherein each of the plurality of hooks and the bar cooperatively form a long gap therebetween for receiving a side edge of the corresponding insert slot.

9. The rack frame of claim 6, wherein a thickness of the connection portion is equal to a width of the insert slot.

10. A rack frame, comprising:
a support pole comprising:
a first portion and a second portion intersecting with the first portion at a corner;
a plurality of securing holes defined on the first and second portions; and each of the plurality of securing holes comprises an insert slot and a protrusion hole communicating with the insert slot; the protrusion hole defining an inclining edge connected to the insert slot; and
a bar fixed on the support pole, the bar comprising:
a first side plate corresponding to the first portion;
a second side plate corresponding to the second portion; and
a plurality of hooks, fixed on the first and second side walls corresponding to the plurality of securing holes; and each of the plurality of hooks is configured to pass through the protrusion hole to be guided along the inclining edge to move in the insert slot.

11. The rack frame of claim 10, further comprising a securing member connected to the support pole; wherein the securing member comprises a base, a first securing portion, and a second securing portion perpendicularly extended from two side edges of the base; the first securing portion comprise a side surface; the first portion comprises a first portion first side wall which is configured to align with the side surface; the second portion comprises a second portion first side wall which is substantially perpendicular to the first portion first side wall; the first portion first side wall is connected to the second portion first side wall; each of the first securing portion and the second securing portion comprises two positioning portions; and each of the first portion first side wall and the second portion first side wall comprises two protrusion portions, the two protrusion portions on the first portion first side wall correspond to the two positioning portions on the first portion, and the two protrusion portions on the second portion first side wall correspond to the two positioning portions on the second portion.

12. The rack frame of claim 11, wherein the first portion further comprises a first portion second side wall that is parallel to the first portion first side wall; the second portion further comprises a second portion second side wall that is parallel to the second portion first side wall; the first portion second side wall is connected to the second portion second side wall; and the plurality of securing holes are defined in the first portion second side wall and the second portion second side wall.

13. The rack frame of claim 12, wherein the first portion further comprises a first portion third side wall connected between the first portion first side wall and the first portion second side wall; the second portion further comprises a second portion third side wall connected between the second portion first side wall and the second portion second side wall; the first portion third side wall is substantially perpendicular to the first portion first side wall; and the second portion third side wall is substantially perpendicular to the second portion first side wall.

14. The rack frame of claim 11, wherein the two protrusion portions are recessed inward from surfaces of the first portion first side wall and the second portion first side wall.

15. The rack frame of claim 4, wherein the first portion further comprises a first portion third side wall connected between the first portion first side wall and the first portion second side wall; the second portion further comprises a second portion third side wall connected between the second portion first side wall and the second portion second side wall; the first portion third side wall is substantially perpendicular to the first portion first side wall; and the second portion third side wall is substantially perpendicular to the second portion first side wall.

16. The rack frame of claim 3, wherein the two protrusion portions are recessed inward from surfaces of the first portion first side wall and the second portion first side wall.

17. A rack frame, comprising:
   a securing member, the securing member comprising a base, a first securing portion and a second securing portion extended from two side edges of the base;
   a support pole comprising:
      a first portion and a second portion; the first portion comprising a first portion first side wall; the second portion comprising a second portion first side wall which is substantially perpendicular to the first portion first side wall; the first portion first side wall connected to the second portion first side wall; each the first and the second securing portions comprising two positioning portions; and each of the first portion first side wall and the second portion first side wall comprising two protrusion portions, the two protrusion portions on the first portion first side wall correspond to the two positioning portions on the first portion, and the two protrusion portions on the second portion first side wall correspond to the two positioning portions on the second portion; the two protrusion portions being recessed inward from surfaces of the first portion first side wall and the second portion first side wall;
      a plurality of securing holes defined on the first and the second portions; and each of the plurality of securing holes comprises an insert slot and a protrusion hole communicating with the insert slot;
   a bar fixed on the support pole, the bar comprising:
      a first side plate corresponding to the first portion;
      a second side plate corresponding to the second portion; and
      a plurality of hooks, fixed on the first and the second side walls corresponding to the plurality of securing holes; and each of the plurality of hooks is configured to pass through the protrusion hole and to move into the insert slot of corresponding one of the plurality of securing holes.

18. The rack frame of claim 17, wherein the first portion further comprises a first portion second side wall parallel to the first portion first side wall, and a first portion third side wall connected between the first portion first side wall and the first portion second side wall; the second portion further comprises a second portion second side wall parallel to the second portion first side wall, and a second portion third side wall connected between the second portion first side wall and the second portion second side wall; the first portion second side wall is connected to the second portion second side wall; the plurality of securing holes are defined in the first portion second side wall and the second portion second side wall; the first portion third side wall is substantially perpendicular to the first portion first side wall; and the second portion third side wall is substantially perpendicular to the second portion first side wall.

19. The rack frame of claim 17, wherein the protrusion hole defines an inclining edge connected to the insert slot; and each of the plurality of hooks is configured to pass through the protrusion hole of the corresponding one of the plurality of securing holes to be guided along the inclining edges to move into the insert slot.

* * * * *